US011740283B2

(12) United States Patent
Ouyang et al.

(10) Patent No.: US 11,740,283 B2
(45) Date of Patent: Aug. 29, 2023

(54) MULTISTORY ELECTRONIC DEVICE TESTING APPARATUS

(71) Applicant: CHROMA ATE INC., Taoyuan (TW)

(72) Inventors: Chin-Yi Ouyang, Taoyuan (TW); Chien-Ming Chen, Taoyuan (TW); Wei-Cheng Kuo, Taoyuan (TW); Xin-Yi Wu, Taoyuan (TW); Iching Tsai, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 0 days.

(21) Appl. No.: 17/834,035

(22) Filed: Jun. 7, 2022

(65) Prior Publication Data

US 2023/0022501 A1 Jan. 26, 2023

(30) Foreign Application Priority Data

Jul. 23, 2021 (TW) ................................. 110127099
Jul. 23, 2021 (TW) ................................. 110127101

(51) Int. Cl.
*G01R 31/28* (2006.01)
*G01R 1/04* (2006.01)

(52) U.S. Cl.
CPC ....... *G01R 31/2893* (2013.01); *G01R 1/0458* (2013.01)

(58) Field of Classification Search
CPC ............. G01R 1/0466; G01R 31/2868; G01R 31/2874; G01R 31/2893; G01R 31/68
See application file for complete search history.

(56) References Cited

U.S. PATENT DOCUMENTS

| 2008/0145203 | A1* | 6/2008 | Yun | ............... G01R 31/2893 414/804 |
| 2011/0254945 | A1* | 10/2011 | Kikuchi | ............ G01R 31/2893 324/750.16 |

FOREIGN PATENT DOCUMENTS

| CN | 101412027 A | 4/2009 |
| TW | 200900711 A | 1/2009 |
| TW | 202045940 A | 12/2020 |

OTHER PUBLICATIONS

Chinese Language Office Action dated Jul. 7, 2022 for corresponding Application TW 110127101.
Chinese Language Office Action dated Jul. 29, 2022 for corresponding Application TW 110127099.

* cited by examiner

*Primary Examiner* — Tung X Nguyen
(74) *Attorney, Agent, or Firm* — McClure, Qualey & Rodack, LLP

(57) ABSTRACT

The present invention relates to a multistory electronic device testing apparatus, which mainly comprises a feeding and binning device, a multi-axis transfer device, a chip-testing device and a main controller. The feeding and binning device includes an upper module and a lower module. The chip-testing device includes a plurality of testing units arranged vertically. The main controller not only controls the feeding, binning and testing operations, but also controls the multi-axis transfer device to transfer an electronic device to be tested or a tested electronic device between the feeding and binning device and the chip-testing device. Accordingly, the three-dimensional arrangement of the feeding and binning module and the testing device is realized, and the accommodating capacity and the testing capacity for the electronic devices to be tested and the tested electronic devices can be increased.

14 Claims, 8 Drawing Sheets

MULTISTORY ELECTRONIC DEVICE TESTING APPARATUS

BACKGROUND OF THE INVENTION

Field of the Invention

The present invention relates to a multistory electronic device testing apparatus and particularly to a testing apparatus for automatically feeding, binning and testing electronic devices.

DESCRIPTION OF THE RELATED ART

The existing semiconductor chip testing machine is designed in a planar arrangement. As shown in FIG. 1, a chip-testing zone Zt is arranged on one side, a chip-loading/unloading zone Zc is arranged on the other side, and at least one chip pick-and-place device Dp for handling chips is arranged.

The chip-testing zone Zt is provided with a plurality of chip-testing modules 11 for a chip test such as system level testing (SLT), and the chip-loading/unloading zone Zc includes a plurality of containers capable of being loaded with chip trays. The containers Include a feeding cassette 12, a non-defective product cassette 13 and a defective product cassette 14. The chip trays contained in the feeding cassette 12 are loaded with chips to be tested. A chip tray loaded with chips to be tested Is transferred to a tray holder 15 before the chips are tested. Then, the chip pick-and-place device Dp transfers the chips to be tested from the tray holder 15 to the chip-testing modules 11. Finally, after the chips are tested, the chip pick-and-place device Dp transfers the tested chips from the chip-testing module 11 to a chip tray in the non-defective product cassette 13 or to a chip tray in the defective product cassette 14 according to test results.

However, testing efficiency of the above-mentioned existing chip testing apparatus is limited. Since precisely matching the time of the transfer operation and the time of the testing operation is difficult, the waiting time of the transfer device or the testing modules is unavoidable. Furthermore, due to the planar arrangement of the existing machine, the existing machine has a large footprint, and utilization of the space is low, resulting in huge site cost. Moreover, according to the arrangement of the existing machine, the chip-loading/unloading zone Zc includes a limited number of the feeding cassettes 12, the non-defective product cassettes 13 and the defective product cassettes 14, frequently resulting in that the feeding cassettes 12 are emptied or that the non-defective product cassettes 13 or the defective product cassettes 14 are full. At this time, the apparatus must be temporarily shut down for replacement of the cassettes. This would inevitably affect efficiency. In addition, the arrangement of the existing chip testing machine is exclusive for only one type of chips to be tested. In other words, a single machine tests one type of chips and is unable to test various types of chips.

An electronic device testing apparatus suitable for various types of electronic devices capable of greatly improving the testing efficiency and the utilization of the site space and increasing the operating time is indeed highly expected by the industry and the general public.

SUMMARY OF THE INVENTION

The main object of the present invention is to provide an electronic device testing apparatus of which a feeding and binning device and a testing device are three-dimensionally disposed in a multistory arrangement, thereby increasing the accommodating capacity for electronic devices to be tested and tested electronic devices and the operating time and greatly increasing the testing capacity and which is suitable for various types of electronic devices to be tested and capable of increasing the test scale and reducing the non-operation time of the apparatus and hence capable of improving the testing efficiency.

In order to achieve the above-mentioned object, a multistory electronic device testing apparatus of the present invention mainly comprises a feeding and binning device, a multi-axis transfer device, a chip-testing device and a main controller, wherein the main controller is electrically connected to the feeding and binning device, the multi-axis transfer device and the chip-testing device; the feeding and binning device includes a lower module and an upper module stacked on the lower module; each of the upper module and the lower module includes a feeding cassette, a discharge cassette, an empty cassette, a shuttle, a chip transfer unit and a tray transfer unit. The feeding cassette is provided to store a first tray, the discharge cassette is provided to store a second tray, and the empty cassette is provided to store a third tray. The first tray is provided to receive electronic devices to be tested, and the second tray is provided to receive tested electronic devices. The main controller controls the shuttle to move between a first position and a second position, the shuttle includes a plurality of chip-accommodating slots. The main controller controls the chip transfer unit to take out the electronic devices to be tested from the first tray and place the electronic devices to be tested in the chip-accommodating slots of the shuttle located at the first position, and the main controller controls the chip transfer unit to take out the tested electronic devices from the chip-accommodating slots of the shuttle located at the first position and place the tested electronic devices on the second tray. The main controller controls the tray transfer unit to take out the first tray from the feeding cassette and place the first tray in the empty cassette, and the main controller controls the tray transfer unit to take out the second tray from the empty cassette and place the second tray in the discharge cassette. The main controller controls the multi-axis transfer device to transfer the electronic devices to be tested between the chip-accommodating slots of the shuttle located at the second position and the chip-testing device and transfer the tested electronic devices between the chip-testing device and the chip-accommodating slots of the shuttle located at the second position.

According to the present invention, the chip-loading/unloading zone, the chip-testing zone and the chip pick-and-place device of the conventional electronic device testing apparatus are designed as three separate modules, that is, the feeding and binning device, the multi-axis transfer device and the chip-testing device. It is more convenient to flexibly increase or decrease the number of modules and arrange the modules in the desired positions as required, According to the present invention, the three-dimensional arrangement of the feeding and binning module is realized by stacking of the upper module and the lower module for increasing the accommodating capacity for the electronic devices and for enablement of various types of tests. The upper module and the lower module each can store different electronic devices to be tested or tested electronic devices, so that the same apparatus can test various devices to be tested. Furthermore, the feeding and binning efficiency is improved with cooperation of the shuttle and the chip transfer unit, so that the shuttle always carries the electronic devices to be tested so as to avoid the waiting time of the apparatus. Moreover, the tray transfer unit can remove empty first trays or supply second trays.

Preferably, each chip-testing device of the present invention includes a frame work and a plurality of testing units. The frame work includes a plurality of accommodating spaces, which are vertically arranged in the frame work. The plurality of testing units are respectively disposed in the plurality of accommodating spaces. In other words, the chip-testing device of the present invention is designed as a three-dimensional multistory arrangement, thereby greatly increasing the number of the testing units. As such, not only the testing capacity is greatly increased for improvement of the testing efficiency and the productivity, but also the chip-testing device can be upgraded for testing various types of electronic devices.

DESCRIPTION OF THE PREFERRED EMBODIMENTS

Figure 1:
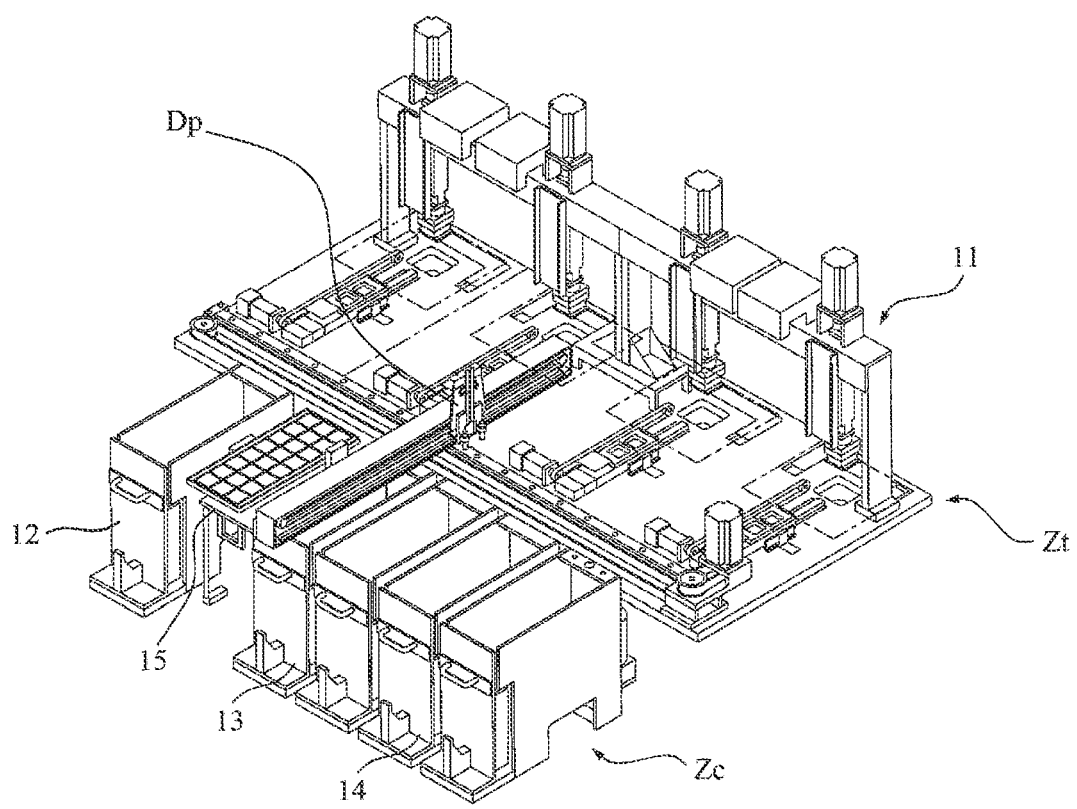
FIG. 1 is a schematic perspective view of a conventional semiconductor chip testing machine.

Before a multistory electronic device testing apparatus of the present invention is described in detail in this embodiment, it should be particularly noted that in the following description, similar components will be designated by the same reference numerals. The drawings of the present invention are merely illustrative and are not necessarily drawn to scale, and not all details are necessarily presented in the drawings.

Figure 2:
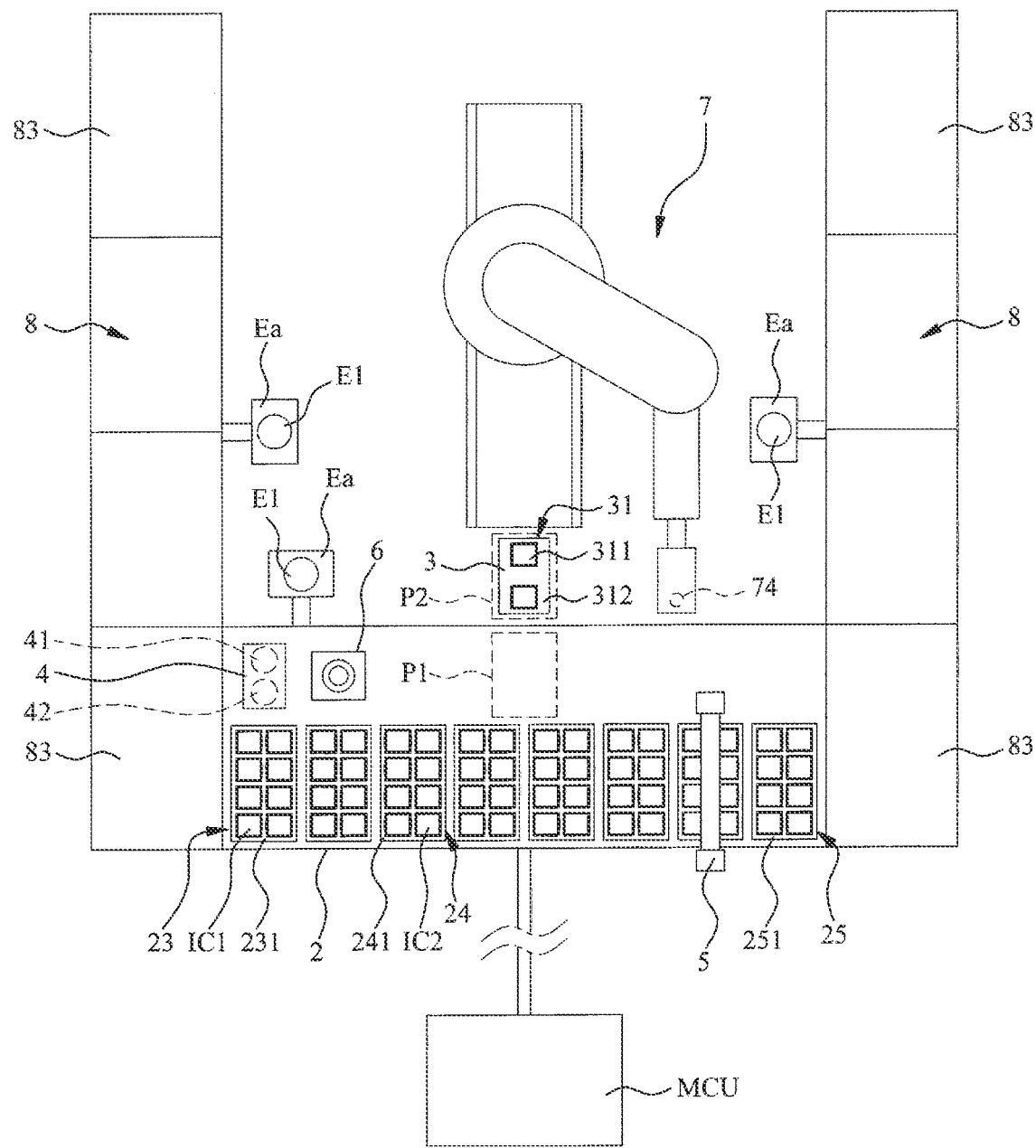
FIG. 2 is a schematic diagram of an electronic device testing apparatus according to a preferred embodiment of the present invention.
Figure 3:
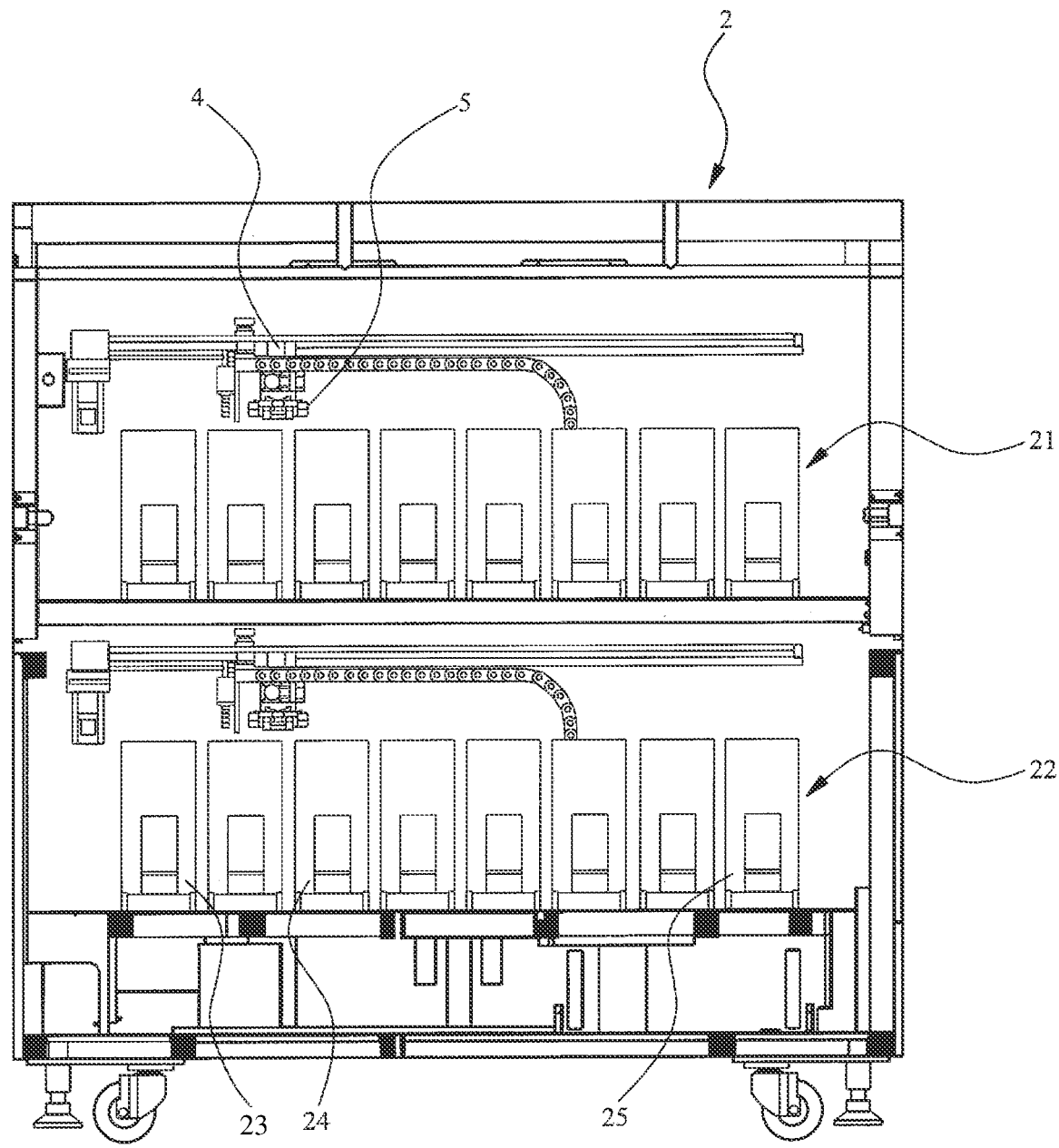
FIG. 3 is a front view of a feeding and binning device according to a preferred embodiment of the present invention.
Figure 4:
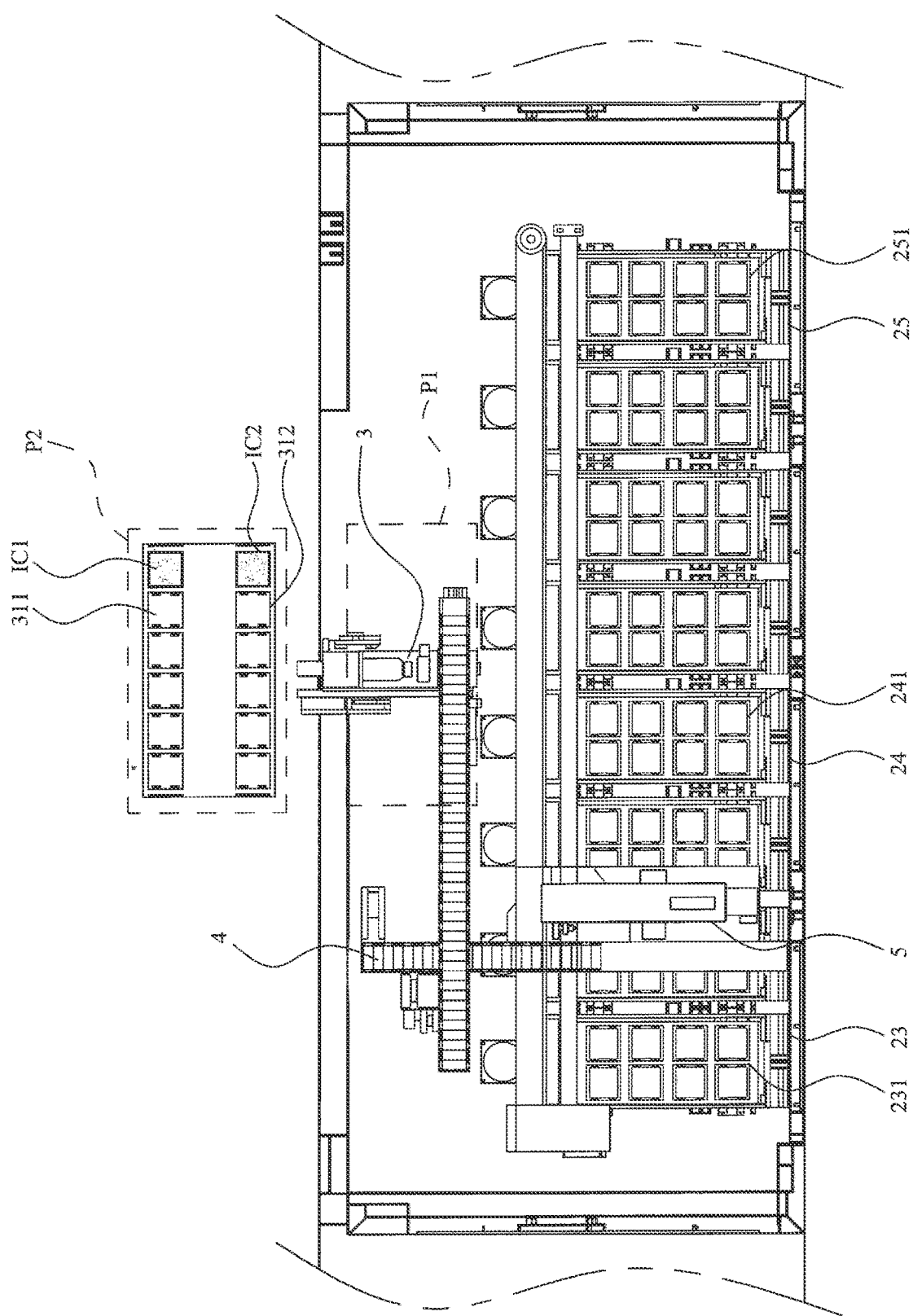
FIG. 4 is a top view of the feeding and binning device according to a preferred embodiment of the present invention.

Reference is made to FIG. 2, FIG. 3 and FIG. 4. FIG. 2 is a schematic diagram of an electronic device testing apparatus according to a preferred embodiment of the present invention. FIG. 3 is a front view of a feeding and binning device according to a preferred embodiment of the present invention. FIG. 4 Is a top view of the feeding and binning device according to a preferred embodiment of the present invention. As shown in the figure, the electronic device testing apparatus of this embodiment mainly includes a feeding and binning device 2, a multi-axis transfer device 7 and two chip-testing devices 8. The two chip-testing devices 8 are separately arranged on two lateral ends of the feeding and binning device 2 to form a U-shaped arrangement, and the multi-axis transfer device 7 is arranged between the two chip-testing devices 8 and the feeding and binning device 2.

As shown in FIG. 3, the feeding and binning device 2 of this embodiment includes an upper module 21 and a lower module 22. The upper module 21 is stacked on the lower module 22. However, it should be particularly noted that the present invention is not limited to the two-story arrangement formed of the upper module 21 and the lower module 22 and can also be a three or more-story arrangement in other aspects of the present invention.

The upper module 21 and the lower module 22 of this embodiment each include a feeding cassette 23, six discharge cassettes 24 and an empty cassette 25. The feeding cassette 23 stores a plurality of stacked first trays 231, each of which is loaded with a plurality of electronic devices to be tested IC1. Each discharge cassette 24 stores at least one second tray 241, which is loaded with tested electronic devices IC2. The six discharge cassettes 24 are arranged according to testing results, such as non-defective products of different grades or defective products. The tested electronic devices IC2 are placed in different discharge cassettes 24 according to the different testing results. The empty cassette 25 stores at least one third tray 251 which can be an empty first tray 231 from which all the electronic devices to be tested IC1 have been removed.

As shown in FIGS. 2 and 4, a shuttle 3 can be selectively moved to a first position P1 or a second position P2. The first position P1 is a position inside the feeding and binning device 2 where the shuttle 3 is to be loaded with the electronic devices to be tested IC1 and unloaded with the tested electronic devices IC2. The second position P2 is a position outside the feeding and binning device 2 where the electronic devices is to be picked up or placed by the multi-axis transfer device 7. In other words, in this embodiment, the second position P2 Is out of the main body of the feeding and binning device 2. The shuttle 3 of this embodiment includes a plurality of chip-accommodating slots 31 in two rows, each row including six chip-accommodating slots. The slots on the shuttle 3 in one of the two rows close to the multi-axis transfer device 7 are designated as first chip-accommodating slots 311 for accommodating the electronic devices to be tested 101, and the slots on the shuttle 3 in the other of the two rows are designated as second chip-accommodating slots 312 for accommodating the tested electronic devices IC2.

A chip transfer unit 4 shown in the figure is provided to transfer the electronic devices to be tested 101 from a first tray 231 to the first chip-accommodating slots 311 of the shuttle 3 located at the first position P1 and to transfer the tested electronic devices IC2 from the second chip-accommodating slots 312 of the shuttle 3 located at the first position P1 to a corresponding second tray 241. The chip transfer unit 4 of this embodiment includes a first pick-and-place device 41 and a second pick-and-place device 42, as shown in FIG. 2. The first pick-and-place device 41 is dedicated to the transfer of the electronic devices to be tested IC1, and the second pick-and-place device 42 is dedicated to the transfer of the tested electronic devices IC2. Accordingly, the chip transfer unit 4 can realize feeding and binning at the same time in a single transfer operation cycle. The first pick-and-place device 41 is used to transfer the electronic devices to be tested IC1 from the first tray 231 to the first chip-accommodating slots 311 while the second pick-andplace device 42 is used to transfer the tested electronic devices IC2 to a corresponding second tray 241.

The upper module 21 and the lower module 22 of this embodiment each have a tray transfer unit 5 for transferring trays. Specifically, the tray transfer unit 5 is used to transfer empty first trays 231 from the feeding cassette 23 to the empty cassette 25 and transfer the empty trays (the empty first trays 231) serving as second trays 241 from the empty cassette 25 to a discharge cassette 24. In other words, when a second tray 241 in a certain discharge cassette 24 is fully loaded with the tested electronic devices IC2, the tray transfer unit 5 transfers an empty tray serving as a second tray 241 from the empty cassette 25 to the discharge cassette 24 so as to make accommodation of the tested electronic devices IC2 uninterrupted.

Moreover, this embodiment is additionally provided with a main controller MCU, which can be an industrial computer equipped with a processor, a memory, a storage medium and other computer hardware components. Although the main controller MCU shown in FIG. 2 Is electrically connected to the feeding and binning device 2, the main controller MCU can also be electrically connected to the multi-axis transfer device 7 and the chip-testing devices 8 for serving as a main controller of the electronic device testing apparatus and for controlling the operations of these devices. Reference is made to FIG. 2 again. In this embodiment, the upper module 21 and the lower module 22 each further have a visual inspection unit 6, which is electrically connected to the main controller MCU. The vision inspection unit 6 can be an imaging element for capturing an image of an inspection target such as a CCD (Charge Coupled Device) or a CMOS (Complementary Metal Oxide Semiconductor).

Figure 5:
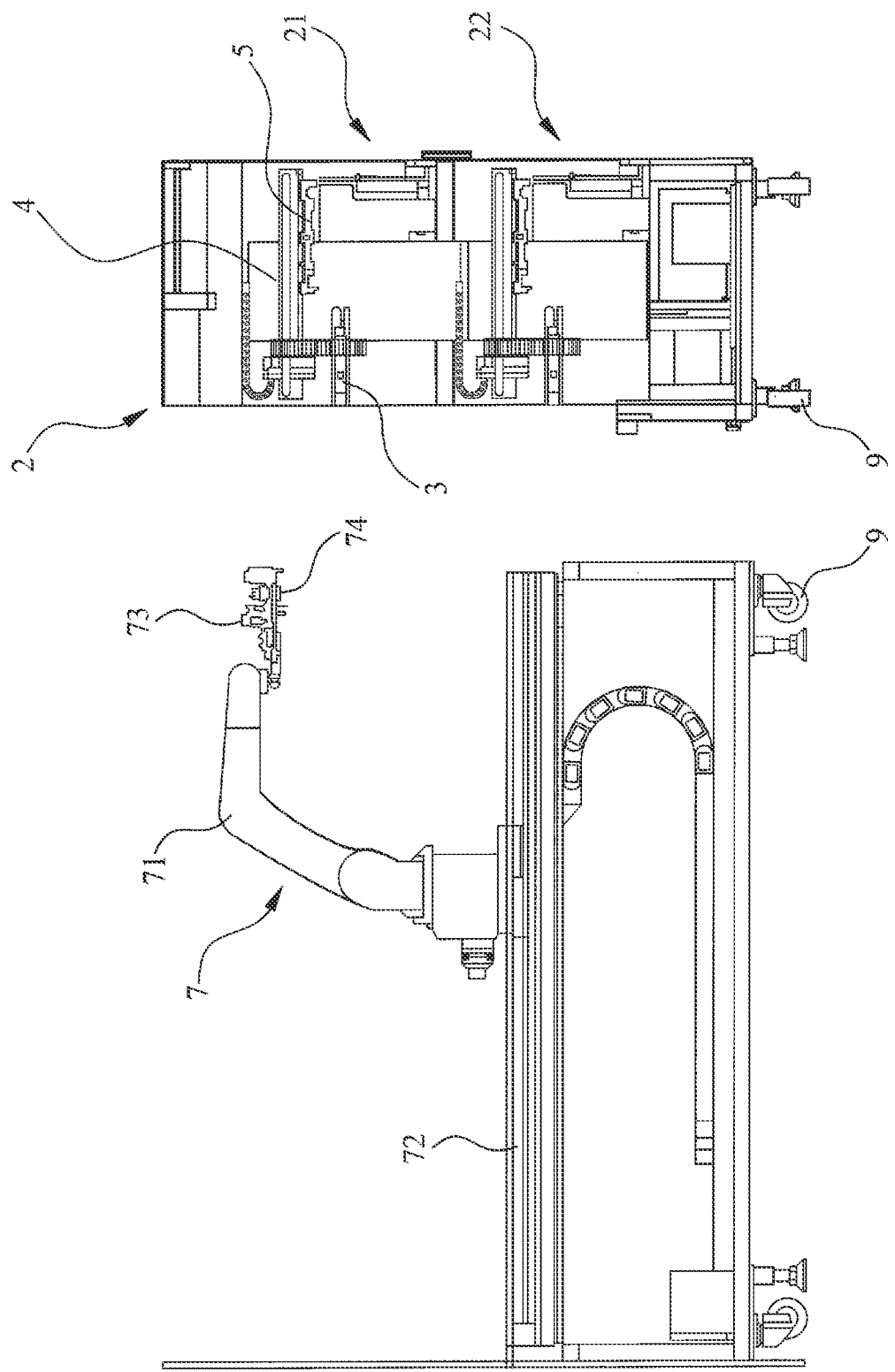
FIG. 5 is a side view of a multi-axis transfer device and the feeding and binning device according to a preferred embodiment of the present invention.

Reference is made to FIGS. 2 and 5. FIG. 5 is a side view of the multi-axis transfer device and the feeding and binning device according to a preferred embodiment of the present invention. As shown in the figures, the multi-axis transfer device 7 of this embodiment includes a robot arm 71, a linear slide module 72 and a pick-and-place device 73. The robotic arm 71 is a six-axis robot arm, which is disposed on the linear slide module 72, and the linear slide module 72 moves the robot arm 71 toward or away from the feeding and binning device 2. The pick-and-place device 73 Is disposed on the robot arm 71 and includes a vacuum pickup for picking up or placing electronic devices.

In other embodiments of the present invention, the pick-and-place device 73 can be additionally provided with other functional elements such as a CCD camera for visual inspection, a barcode reader for identifying elements or devices. The multi-axis transfer device 7 is used to transfer the electronic devices to be tested IC1 from the chip-accommodating slots 31 of the shuttle 3 located at the second position P2 to the chip-testing devices 8 and transfer the tested electronic devices IC2 from the chip-testing devices 8 to the chip-accommodating slots 31 of the shuttle 3 located at the second position P2.

Figure 6:
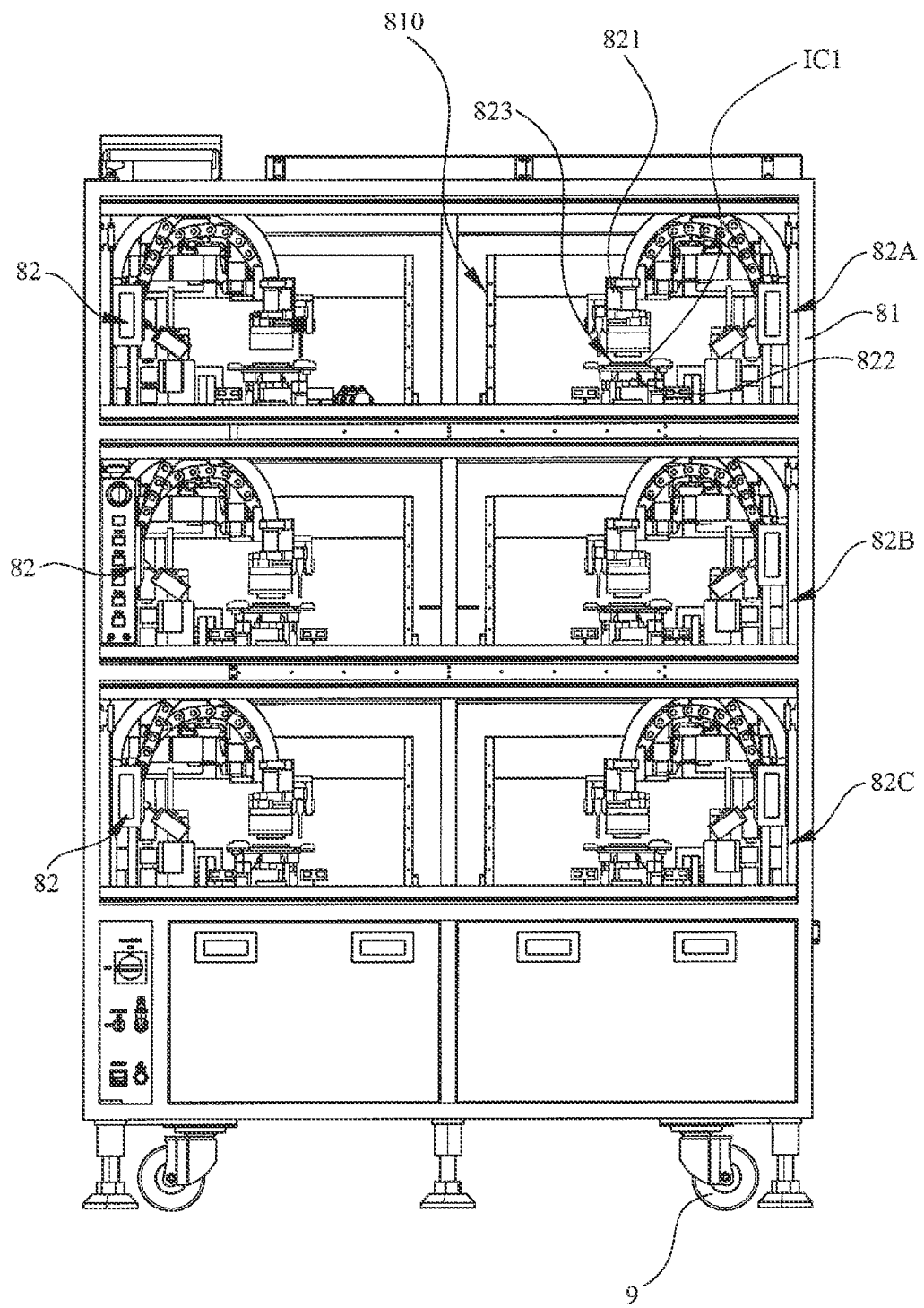
FIG. 6 is a front view of a chip-testing device according to a preferred embodiment of the present Invention.
Figure 7A:
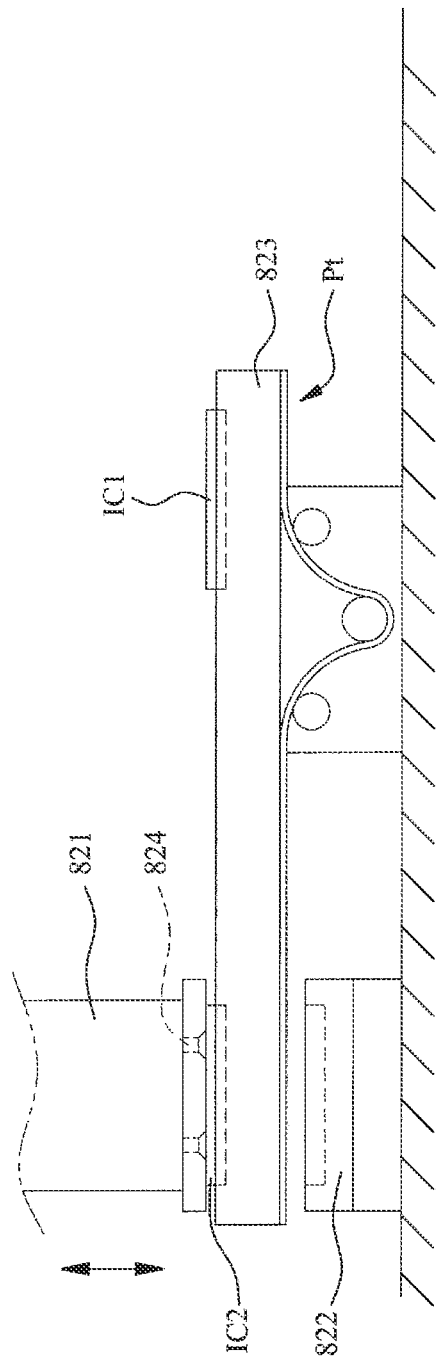
FIG. 7A is a schematic diagram of a multistory testing module according to a preferred embodiment of the present invention with a chip shuttle located at a first position.
Figure 7B:
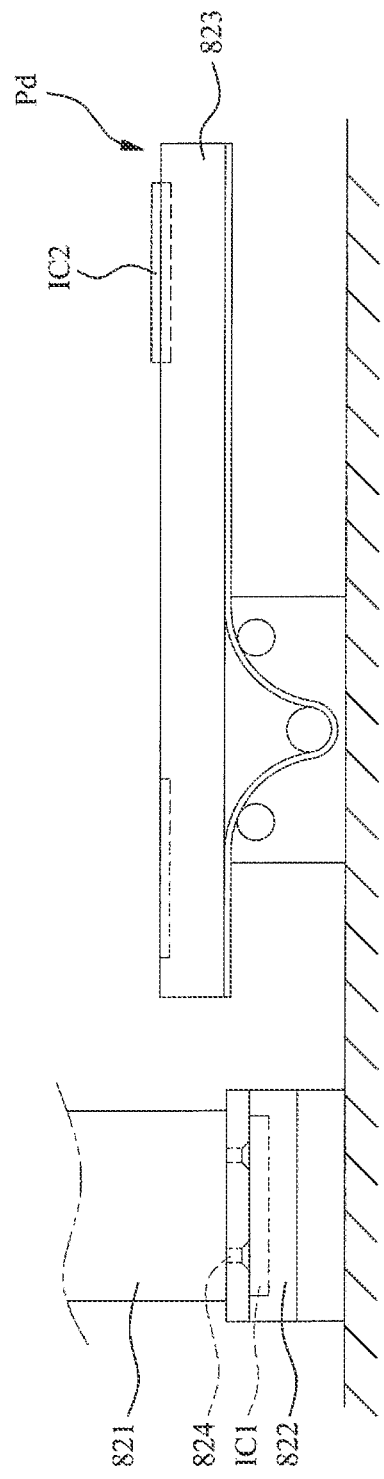
FIG. 7B Is a schematic diagram of the multistory testing module according to a preferred embodiment of the present invention with a chip shuttle located at a second position.

Reference is made to FIG. 2, FIG. 6, FIG. 7A and FIG. 7B. FIG. 6 is a front view of the chip-testing device according to a preferred embodiment of the present invention. FIG. 7A is a schematic diagram of a multistory testing module according to a preferred embodiment of the present invention with a chip shuttle located at a first position. FIG. 7B is a schematic diagram of the multistory testing module according to a preferred embodiment of the present invention with a chip shuttle located at a second position. In this embodiment, each chip-testing device 8 includes a frame work 81, six testing-units 82 and two temperature control modules 83. The temperature control modules 83 are shown in FIG. 2. The frame work 81 includes six accommodating spaces 810, which are vertically arranged in the frame work 81 in three stories, and each story includes two accommodating spaces 810. The six testing units 82 are respectively disposed in the six accommodating spaces 810.

In this embodiment, each testing unit 82 includes a pressing head 821, a socket 822 and a chip shuttle 823. The pressing head 821 is disposed above the socket 822, and the chip shuttle 823 is selectively located at a test position Pt or a pick-and-place position Pd. As shown in FIG. 7A, the test position Pt refers to a position where the chip shuttle 823 is located between the pressing head 821 and the socket 822 so that the pressing head 821 can pick up and place electronic devices. As shown in FIG. 7B, the pick-and-place position Pd refers to a position where the chip shuttle 823 is moved away from between the pressing head 821 and the socket 822 so that the multi-axis transfer device 7 can pick up and place a tested electronic device IC2 and an electronic device to be tested IC1.

To make a further explanation, the pressing head 821 of this embodiment includes a plurality of negative pressure suction ports 824. When the chip shuttle 823 is located at the test position Pt, the pressing head 821 descends and approaches the chip shuttle 823 to pick up an electronic device to be tested IC1 with the negative pressure suction ports 824 or place a tested electronic device IC2 in the chip shuttle 823 with the negative pressure suction ports 824. Usually, after the tested electronic device IC2 is placed in the chip shuttle 823, the chip shuttle 823 is slightly moved so that the pressing head 821 can pick up the electronic device to be tested IC1.

After the pressing head 821 picks up the electronic device to be tested IC1, the chip shuttle 823 is moved to the pick-and-place position Pd away from between the pressing head 821 and the socket 822. At this time, the pressing head 821 descends and approaches the socket 822 to place the electronic device to be tested IC1 in the socket 822 and continuously presses the electronic device to be tested IC1 and test the electronic device to be tested IC1, as shown in FIG. 7B.

On the other hand, as shown in FIG. 2, the two temperature control modules 83 are respectively provided on both sides of the frame work 81 and are connected to the pressing head 821 of each testing unit 82. The temperature control module 83 provides a temperature control fluid of a high temperature or of a low temperature to the pressing head 821 to regulate the temperature of the electronic device to be tested IC1 and maintain the temperature of the electronic device to be tested IC1 at a specific temperature for a high-temperature test or a low-temperature test. Of course, the temperature control module 83 of the present invention is not limited to only providing the temperature control fluid to the pressing head 821, but the temperature control fluid can also be simultaneously provided to the socket 822 to create a complete temperature control environment, or the temperature control fluid can also be provided to the chip shuttle 823 to preheat or precool the electronic device to be tested IC1 so as to reduce the time period in which the electronic device to be tested IC1 is cooled or heated by the pressing head 821 to the specific temperature.

Reference is made to FIGS. 2 to 6. In the following description, the operation process of the electronic device testing apparatus of this embodiment will be described. First, the first pick-and-place device 41 of the chip transfer unit 4 picks up an electronic device to be tested IC1 from a first tray 231 in the feeding cassette 23 and moves the electronic device to be tested IC1 to the visual inspection unit 6. The solder ball contacts on the bottom surface of the electronic device to be tested IC1 are Inspected by the visual inspection unit 6. The inspection method of the solder ball contacts can be carried out by capturing an image of the bottom surface of the electronic device to be tested IC1 and comparing the captured image with an image of a non-defective product pre-stored in the main controller MCU. If the captured image is not coincident with the pre-stored image, it is determined that the electronic device to be tested IC1 is a defective product. In this case, the chip transfer unit 4 directly moves the defective product to a corresponding discharge cassette 24 and places the defective product in a second tray 241.

When the electronic device to be tested IC1 passes the visual inspection, it is moved to the first position P1. At this time, the shuttle 3 is also located at the first position P1, and a tested electronic device IC2 is, already accommodated in a second chip-accommodating slot 312. Next, the first pick-and-place device 41 of the chip transfer unit 4 places the electronic device to be tested IC1 in a first chip-accommodating slot 311 of the shuttle 3 while the second pick-and-place device 42 of the chip transfer unit 4 picks up the tested electronic device IC2 in the second chip-accommodating slot 312.

The shuttle 3 moves to the second position P2, and at the same time, the chip transfer unit 4 moves to a corresponding discharge cassette 24 according to the testing result of the tested electronic device IC2 and places it in a second tray 241. At this time, the pick-and-place device 73 of the multi-axis transfer device 7 picks up the electronic device to be tested IC1 at the second position P2 and transfers it to one of the testing units 82 in the chip-testing device 8. The multi-axis transfer device 7 places the electronic device to be tested IC1 in the chip shuttle 823 located at the pick-and-place position Pd and then picks up a tested electronic device IC2 in the chip shuttle 823. The multi-axis transfer device 7 transfers the tested electronic device IC2 to the second position P2 and places it in a second chip-accommodating slot 312 of the shuttle 3. As such, a process for feeding, testing and binning electronic devices is accomplished.

After an actual test is carried out, it is found that the feeding and binning operation of the existing electronic device testing apparatus takes more than 10.5 seconds (the actual test time is excluded). However, in the case of the arrangement of this embodiment, time for the feeding and binning operation can be shortened to 7 seconds or less, and the transfer efficiency is greatly improved.

In particular, in the case that the test has to be redone, for example, failure of the test is caused by instability of the system, or a specific test result is obtained, the main controller MCU controls the chip transfer unit 4 to take out a tested electronic device IC2 that needs to be retested from a second chip-accommodating slot 312 and place it in a first chip-accommodating slot 311. The pick-and-place device 73 of the multi-axis transfer device 7 picks up the tested electronic device IC2 so that the tested electronic device IC2 can be re-tested.

This embodiment also has a self-diagnostic function for the testing units. Specifically, the electronic device to be tested IC1 which is determined as a defective product is re-tested for determining whether the test result is caused by the defective product or failure of the testing apparatus. Referring to FIG. 6, for example, two of the six testing units 82 are temporarily and respectively designated as a first testing unit 82A and a second testing unit 82B. If a tested electronic component IC2 is determined as a defective product by the first testing unit 82A, the main controller MCU controls the multi-axis transfer device 7 to transfer the tested electronic component IC2 to the second testing unit 82B for re-testing the tested electronic component IC2. If the tested electronic device IC2 Is determined as a non-defective product by the second testing unit 82B, the main controller MCU marks the first testing unit 82A. If the first testing unit 82A is marked twice (it means that the above-mentioned situation occurs repeatedly), the main controller MCU determines that the operation of the first testing unit 82A is abnormal and stops the operation of the first testing unit 82A.

In other embodiments of the present invention, for caution's sake, if the test result of the tested electronic device IC2 made by the first testing unit 82A is different from the test result of the same tested electronic device IC2 made by the second testing unit 82B, the tested electronic device IC2 can be re-tested by a third testing unit 82C so as to determine whether the first testing unit 82A or the second testing unit 82B is abnormal.

Moreover, this embodiment further provides an automatic calibration method for calibrating positions of different modules such as the feeding and binning device 2, the multi-axis transfer device 7 and the two chip-testing devices 8. For a long time, the position arrangement and calibration of different components are very troublesome tasks during the installation of the machine. Presence of an error causes the multi-axis transfer device 7 to be unable to pick up and place chips and causes shutdown of the entire apparatus at worst. This embodiment provides the following automatic calibration mechanism capable of solving the above-mentioned problems.

Figure 8:
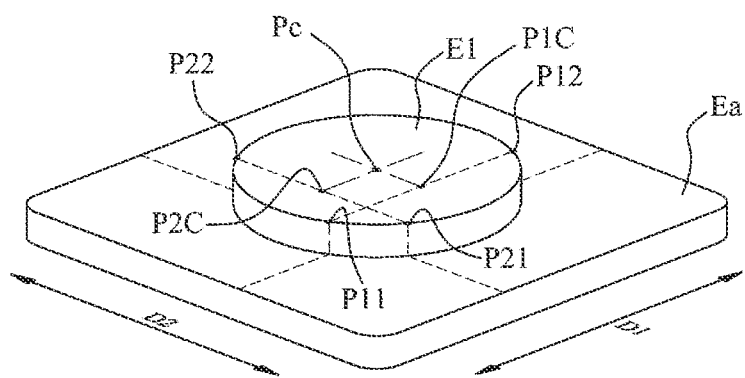
FIG. 8 Is a perspective view of a calibration element according to a preferred embodiment of the present invention.

Reference is made to FIGS. 2 and 8. FIG. 8 is a perspective view of a calibration element according to a preferred embodiment of the present invention. In this embodiment, the feeding and binning device 2 and the two chip-testing devices 8 each include a calibration element Ea, which is a flat plate with a circular boss E1 protruding upward, and the multi-axis transfer device 7 includes a laser ranging unit 74. The laser ranging unit 74 is based on the time-of-flight principle. The distance between the laser ranging unit 74 and a target is measured based on the time difference between emission of a laser pulse to the target and return of the reflected laser pulse to the laser ranging unit 74.

The main controller MCU controls the laser ranging unit 74 of the multi-axis transfer device 7 to scan the circular bosses E1 on the calibration elements Ea of the feeding and binning device 2 and the two chip-testing devices 8 and acquire the position coordinates of these circular bosses. The main controller MCU uses these position coordinates as the calibration coordinates of the feeding and binning device 2 and the two chip-testing devices 8. The position coordinates of the circular bosses E1 are the coordinates of the centers of the circular bosses E1, and the specific method for obtaining them is described later.

Reference is made to FIG. 8. First, the main controller MCU controls the multi-axis transfer device 7 to scan the circular boss E1 on the calibration element Ea in a first direction D1 with the laser ranging unit 74. When the laser ranging unit 74 scans the circular boss E1, the main controller MCU records a first initial boss position P11 where a sudden rise of a surface height is detected and a first terminal boss position P12 where a sudden drop of the surface height is detected. Then, the main controller acquires a first mid-point position P1C between the first initial boss position P11 and the first terminal boss position P12 in the first direction D1.

The main controller MCU controls the laser ranging unit 74 to scan the circular boss E1 on the calibration element Ea in a second direction D2. When the laser ranging unit 74 scans the circular boss E1, the main controller MCU records a second initial boss position P21 where a sudden rise of the surface height is detected and a second terminal boss position P22 where a sudden drop of the surface height is detected. Then, the main controller acquires a second midpoint position P2C between the second Initial boss position P21 and the second terminal boss position P22 in the second direction D2. Finally, the main controller MCU acquires an intersected center position Pc of an extension line extending from the first midpoint position NC in a direction perpendicular to the first direction D1 and an extension line extending from the second midpoint position P2C in a direction perpendicular to the second direction D2. The intersected center positions C1 of the circular bosses E1 serve as the calibration coordinates of the feeding and binning device 2 and the two chip-testing device 8.

The main controller MCU can use the calibration coordinates as origin position coordinates of the feeding and binning device 2 and the two chip-testing device 8 for calibrating the positions of the multi-axis transfer device 7, the feeding and binning device and the two chip-testing devices 8. According to the calibration coordinates, the main controller MCU can control the multi-axis transfer device 7 to accurately transfer electronic devices to be tested IC1 from the feeding and binning device 2 to the chip-testing devices 8 and accurately transfer tested electronic devices IC2 from the chip-testing devices 8 to the feeding and binning device 2. Accordingly, the above-mentioned automatic calibration mechanism can eliminate the troublesome alignment and calibration process for each component during the installation of the traditional apparatus and can not only greatly improve the installation efficiency but also can accurately position and calibrate components so that the multi-axis transfer device 7 is capable of precisely picking and placing electronic devices.

Finally, reference is made to FIGS. 5 and 6 again. Each of the feeding and binning device 2, the multi-axis transfer device 7 and the two chip-testing devices 8 of this embodiment is provided with a plurality of casters 9 for convenience of installation, movement and position calibration. In other words, the electronic device testing apparatus of this embodiment has greater mobility and flexibility and is very convenient for installation, maintenance or retirement of the devices.

The preferred embodiments of the present Invention are illustrative only, and the claimed inventions are not limited to the details disclosed in the drawings and the specification. Accordingly, it is intended that it have the full scope permitted by the language of the following claims.

What is claimed is:

1. A multistory electronic device testing apparatus, comprising:
    a feeding and binning device;
    a multi-axis transfer device;
    at least one chip-testing device; and
    a main controller, electrically connected to the feeding and binning device, the multi-axis transfer device and the at least one chip-testing device,
    wherein the feeding and binning device includes an upper module and a lower module; the upper module is stacked on the lower module; the upper module and the lower module each include at least one feeding cassette, at least one discharge cassette, a shuttle and a chip transfer unit;
    the at least one feeding cassette is provided to store at least one first tray; the at least one discharge cassette is provided to store at least one second tray; the at least one first tray is provided to receive at least one electronic device to be tested; the at least one second tray is provided to receive at least one tested electronic device,
    wherein the main controller controls the shuttle to move between a first position and a second position; the shuttle includes at least one chip-accommodating slot; the main controller controls the chip transfer unit to take out the at least one electronic device to be tested from the at least one first tray and place the at least one electronic device to be tested in the at least one chip-accommodating slot of the shuttle located at the first position; and the main controller controls the chip transfer unit to take out the at least one tested electronic device from the at least one chip-accommodating slot of the shuttle located at the first position and place the at least one tested electronic device on the at least one second tray,
    wherein the main controller controls the multi-axis transfer device to transfer the at least one electronic device to be tested between the at least one chip-accommodating slot of the shuttle located at the second position and the chip-testing device and transfer the at least one tested electronic device between the chip-testing device and the at least one chip-accommodating slot of the shuttle located at the second position.

2. The multistory electronic device testing apparatus of claim 1, wherein the upper module and the lower module each further include a visual inspection unit; the main controller controls the chip transfer unit to take out the at least one electronic device to be tested from the at least one first tray and transfer the at least one electronic device to be tested to the visual inspection unit; the main controller controls the visual inspection unit to inspect the at least one electronic device to be tested, and then the at least one electronic device to be tested is transferred to the at least one chip-accommodating slot of the shuttle.

3. The multistory electronic device testing apparatus of claim 1, wherein the chip transfer unit includes a first pick-and-place device and a second pick-and-place device; the shuttle includes a first chip-accommodating slot and a second chip-accommodating slot; the main controller controls the chip transfer unit to take out the at least one electronic device to be tested from the at least one first tray and place the at least one electronic device to be tested in the first chip-accommodating slot of the shuttle by means of the first pick-and-place device; and the main controller controls the chip transfer unit to take out the at least one tested electronic device from the second chip-accommodating slot of the shuttle and place the at least one tested electronic device on the at least one second tray by means of the second pick-and-place device.

4. The multistory electronic device testing apparatus of claim 3, wherein when the main controller intends to re-test the tested electronic device, the main controller controls the chip transfer unit to take out the at least one tested electronic device from the second chip-accommodating slot and place the at least one tested electronic device in the first chip-accommodating slot.

5. The multistory electronic device testing apparatus of claim 1, comprising two chip-testing devices, which are separately arranged on two lateral ends of the feeding and binning device to form a U-shaped arrangement, and the multi-axis transfer device is arranged between the two chip-testing devices and the feeding and binning device.

6. The multistory electronic device testing apparatus of claim 5, wherein each chip-testing device includes a frame work and a plurality of testing units; the frame work includes a plurality of accommodating spaces, which are vertically arranged in the frame work; the plurality of testing units are respectively disposed in the plurality of accommodating spaces; each testing unit includes a pressing head, a socket and a chip shuttle; the pressing head is disposed above the socket; the chip shuttle is capable of being selectively located at a test position where the chip shuttle is located between the pressing head and the socket or a pick-and-place position where the chip shuttle is away from between the pressing head and the socket so that the electronic device to be tested and the tested electronic device are picked and placed by the multi-axis transfer device.

7. The multistory electronic device testing apparatus of claim 6, wherein the pressing head includes at least one negative pressure suction port; when the chip shuttle is located at the test position, the pressing head approaches the chip shuttle to suck the electronic device to tested with the at least one negative pressure suction port or place the tested electronic device in the chip shuttle with the at least one negative pressure suction port; when the chip shuttle is located at the pick-and-place position, the pressing head approaches the socket to place the electronic device to be tested in the socket and continuously presses the electronic device to be tested for testing the electronic device to be tested.

8. The multistory electronic device testing apparatus of claim 7, wherein each chip-testing device includes at least one temperature control module, which is disposed on one side of the frame work; the temperature control module is connected to at least one of the pressing head, the socket and the chip shuttle of the plurality of testing units; the temperature control module regulates a temperature of the electronic device to be tested through at least one of the pressing head, the socket and the chip shuttle.

9. The multistory electronic device testing apparatus of claim 7, wherein the plurality of testing units include a first testing unit and a second testing unit; when it is determined by the first testing unit that the tested electronic device is defective, the main controller controls the multi-axis transfer device to transfer the tested electronic device to the second testing unit for performing a test; when it is determined by the second testing unit that the tested electronic device is non-defective, the main controller marks the first testing unit; if the first testing unit is marked twice, the main controller deactivates the first testing unit.

10. The multistory electronic device testing apparatus of claim 1, wherein the feeding and binning device and the at least one chip-testing device each include a calibration element; the main controller controls the multi-axis transfer device to scan the calibration elements and acquire position coordinates of the calibration elements; the main controller uses the position coordinates of the calibration elements of the feeding and binning device and the at least one chip-testing device as calibration coordinates of the feeding and binning device and the at least one chip-testing device respectively; according to the calibration coordinates, the main controller controls the multi-axis transfer device to transfer the electronic device to be tested to the at least one chip-testing device from the feeding and binning device and controls the multi-axis transfer device to transfer the tested electronic device to the feeding and binning device from the at least one chip-testing device.

11. The multistory electronic device testing apparatus of claim 10, wherein each calibration element includes at least one circular boss; the multi-axis transfer device includes a laser ranging unit; the main controller controls the multi-axis transfer device to scan the at least one circular boss on the calibration element with the laser ranging unit in a first direction and a second direction, thereby acquiring an intersected center position of the at least one circular boss; the intersected center positions serve as the calibration coordinates of the feeding and binning device and the at least one chip-testing device.

12. The multistory electronic device testing apparatus of claim 11, wherein the main controller controls the multi-axis transfer device to scan the at least one circular boss on the calibration element in the first direction with the laser ranging unit; when the laser ranging unit scans the at least one circular boss, a first initial boss position and a first terminal boss position generated due to height variation are recorded; the main controller acquires a first midpoint position between the first initial boss position and the first terminal boss position in the first direction; the main controller controls the laser ranging unit to scan the at least one circular boss on the calibration element in the second direction; when the laser ranging unit scans the at least one circular boss, a second initial boss position and a second terminal boss position generated due to height variation are recorded; the main controller acquires a second midpoint position between the second initial boss position and the second terminal boss position in the second direction; the main controller acquires an intersected point of a first extension line extending from first midpoint position in a direction perpendicular to the first direction and a second extension line extending from the second midpoint position in a direction perpendicular to the second direction as the intersected center position.

13. The multistory electronic device testing apparatus of claim 1, wherein the multi-axis transfer device includes a robot arm and a linear slide module; the robot arm is disposed on the linear slide module; the linear slide module moves the robot arm toward or away from at least one of the feeding and binning device and the at least one chip-testing device.

14. The multistory electronic device testing apparatus of claim 1, further comprising at least one empty cassette and a tray transfer unit; the at least one empty cassette is provided to store at least one third tray; the main controller controls the tray transfer unit to take out the at least one first tray from the at least one feeding cassette and place the at least one first tray in the at least one empty cassette; and the main controller controls the tray transfer unit to take out the at least one second tray from the at least one empty cassette and place the at least one second tray in the at least one discharge cassette.

* * * * *